(12) United States Patent
Shaikh et al.

(10) Patent No.: US 7,541,835 B1
(45) Date of Patent: Jun. 2, 2009

(54) CIRCUIT TECHNIQUE TO ACHIEVE POWER UP TRISTATE ON A MEMORY BUS

(75) Inventors: Ashfaq R. Shaikh, San Jose, CA (US);
Chang Hee Hong, Pleasanton, CA (US);
Ting-Sheng Ku, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 599 days.

(21) Appl. No.: 11/299,081

(22) Filed: Dec. 8, 2005

(51) Int. Cl.
*H03K 19/00* (2006.01)
(52) U.S. Cl. ............................. 326/56; 326/57; 326/62; 326/82
(58) Field of Classification Search ............ 326/62–63, 326/68, 80–81, 56–58; 327/333, 112
See application file for complete search history.

(56) References Cited

U.S. PATENT DOCUMENTS

| 6,335,637 B1* | 1/2002 | Correale et al. | ............... 326/80 |
| 6,744,298 B2* | 6/2004 | Yamauchi et al. | ........... 327/333 |
| 6,753,697 B2* | 6/2004 | Nakase | ........................ 326/68 |

\* cited by examiner

*Primary Examiner*—Anh Q Tran
(74) *Attorney, Agent, or Firm*—Patterson & Sheridan LLP

(57) ABSTRACT

Techniques and circuits for ensuring undefined control signals are not inadvertently driven onto a bus due to core logic and I/O logic supply voltages reaching final voltage levels at different times are provided. According to some embodiments, an internal voltage supply sense circuit may monitor a level of a voltage supply that powers core logic that generates control signals to be driven on I/O pads. The sense circuit may generate one or more control signals used to keep I/O pads in a high impedance state.

17 Claims, 7 Drawing Sheets

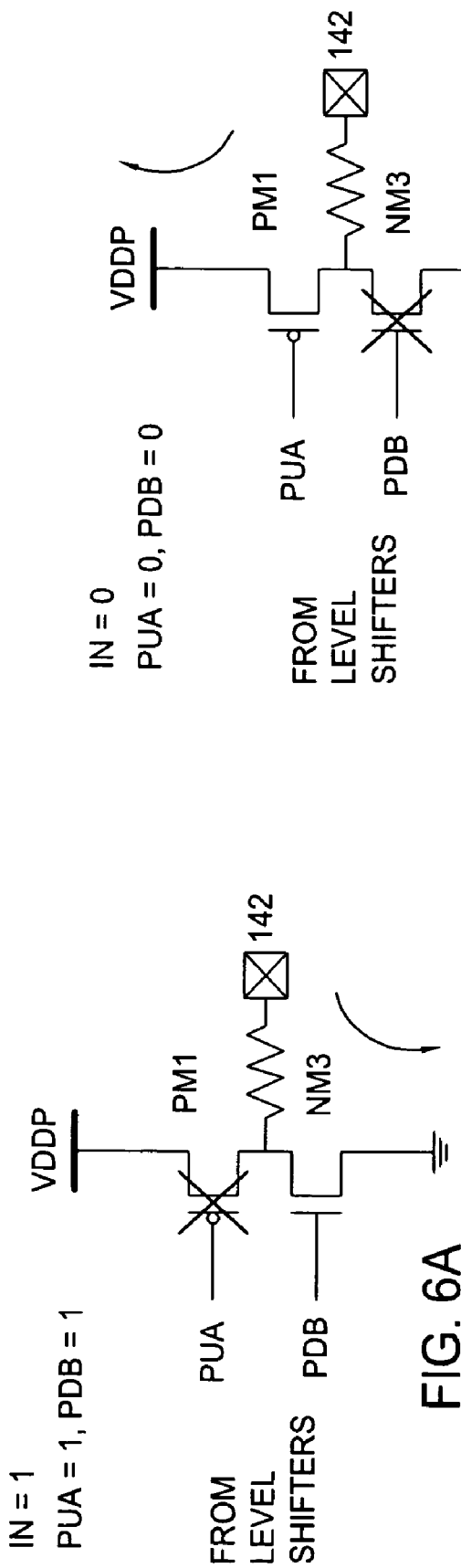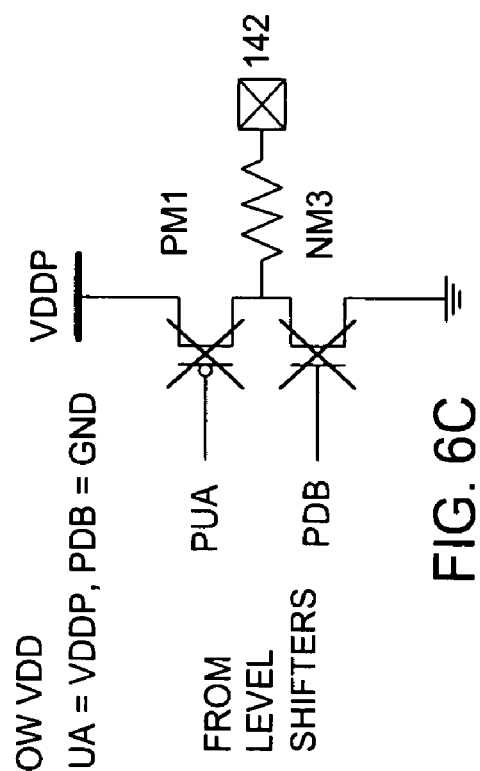
FIG. 6A, FIG. 6B, FIG. 6C

CIRCUIT TECHNIQUE TO ACHIEVE POWER UP TRISTATE ON A MEMORY BUS

CROSS-REFERENCE TO RELATED APPLICATIONS

This application is related to co-pending U.S. patent application entitled, "CIRCUIT TECHNIQUE TO PREVENT DEVICE OVERSTRESS" Ser. No. 11/299,080, filed herewith and incorporated herein in its entirety.

BACKGROUND OF THE INVENTION

1. Field of the Invention

This invention relates generally to computer systems and more specifically to a technique for ensuring undesired command sequences are not inadvertently sent out on a bus due to a slowly ramping or otherwise low logic supply voltage.

2. Description of the Related Art

In a typical processor device, such as a central processor unit (CPU) or graphics processing unit (GPU), different logic portions may be powered from different supply voltages. For example, in a GPU, core processing logic that processes data and generates command signals to external devices (e.g., memory devices) may be powered from a first supply voltage (e.g., VDD), while input output (I/O) logic that drives those command signals onto I/O pads may be powered from a second supply voltage (e.g., VDDP). In an effort to conserve power and increase operating frequency, the supply voltage used to power the core logic may be lower than the supply voltage used to power the I/O logic.

Unfortunately, during power up or power down of the device, the I/O supply voltage may reach its final value while the core supply voltage is still ramping up or is completely off. Under such conditions, control signals supplied by the core logic to be driven onto the I/O pads by the I/O logic, which are driven to core voltage supply levels, may not set to correct levels. Because the I/O supply voltage is ramped up to the final level, incorrect signal levels may be driven onto the I/O pad outputs connected to the bus between GPU and memory devices. In some cases, one or more control signals used to latch commands to a memory device, such as a clock signal (CK), clock enable signal (CKE), or chip select signal (CS), may inadvertently toggle while undetermined values are present on other signal lines whose logic levels define the commands. As a result, certain command or command sequences may be inadvertently sent to the memory devices, which may place them in an inoperable ("locked") state. In some cases, it may not be possible to recover from this inoperable state without applying a system level reset and/or otherwise applying a correct power sequence.

In some conventional systems, this situation has been addressed by generating an external control signal which is at I/O supply voltage level and is indicative of the core logic supply voltage level. This external control signal may be distributed to all the I/O pad driver circuits internally and used to keep the I/O pads in a high impedance state (tristate) until the final core logic supply voltage level has been reached. This approach is suboptimal because it requires the additional circuitry for generating such a signal and adds complexity as the signal must be distributed across all the pads within the I/O pad routing section (ring) of the GPU die.

Another approach is to utilize external components to ensure a proper power sequence is achieved. For example, circuit components may be arranged to ensure the core logic supply voltage supplied to the device has reached a final level before the I/O logic supply voltage is supplied to the device. However, this approach is also suboptimal as it adds components to the system bill of materials (BOMs) and increases overall cost and complexity.

Accordingly, what is needed is an improved technique to avoid the problems encountered when core logic and I/O logic supply voltages reach final voltage levels at different times.

SUMMARY OF THE INVENTION

Embodiments of the present invention generally provide methods and apparatus for ensuring undefined control signals are not inadvertently driven onto a bus due to core logic and I/O logic supply voltages reaching final voltage levels at different times.

One embodiment provides a method of controlling one or more input output (I/O) pads of an integrated circuit device having core logic powered by a first supply voltage and I/O logic powered by a second supply voltage. The method generally includes determining if the first supply voltage is below a predetermined voltage level, if the first supply voltage is not below the predetermined voltage level, driving onto the I/O pads control signals generated by the core logic, and if the first supply voltage is below the predetermined voltage level, maintaining the I/O pads in a high impedance state by the I/O logic.

Another embodiment provides an integrated circuit device generally including one or more input/output (I/O) pads, core logic, I/O logic, and power sense logic. The core logic is powered by a first supply voltage and configured to generate one or more control signals, while the I/O logic powered by a second supply voltage and configured to drive control signals generated by the core logic onto the I/O pads. The power sense logic is configured to determine if the first supply voltage is below a predetermined voltage level and, if so, generate one or more signals to cause the I/O logic to maintain the I/O pads in a high impedance state.

Another embodiment provides a computer system generally including one or more memory devices and at least one processor device. The at least one processor device has one or more input/output (I/O) pads coupled to the memory devices via a bus, core logic powered by a first supply voltage and configured to generate one or more control signals, I/O logic powered by a second supply voltage and configured to drive control signals generated by the core logic onto the I/O pads, and power sense logic. The power sense logic is configured to determine if the first supply voltage is below a predetermined voltage level and, if so, generate one or more signals to cause the I/O logic to maintain the I/O pads in a high impedance state.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6A-6C illustrate an exemplary final stage driver for an output pad, in accordance with one embodiment of the present invention.

DETAILED DESCRIPTION

Embodiments of the present invention provide a technique for ensuring undefined control signals are not inadvertently driven onto a bus due to core logic and I/O logic supply voltages reaching final voltage levels at different times. According to some embodiments, an internal voltage supply sense circuit may monitor a level of a voltage supply that powers core logic that generates control signals to be driven on I/O pads. The sense circuit may generate one or more control signals used to keep I/O pads in a high impedance state.

As a specific, but not limiting example, one embodiment of the present invention provides a graphics processing unit (GPU) with an internal circuit that monitors core logic supply voltage and generates one or more signals to keep I/O pad outputs in a high impedance state. However, those skilled in the art will recognize that the concepts described herein may be used to similar advantage in a variety of different devices, such as central processing units (CPUs) digital signal processors (DSPs), and the like, that utilize different supply voltages.

An Exemplary Graphics Subsystem

Figure 1:
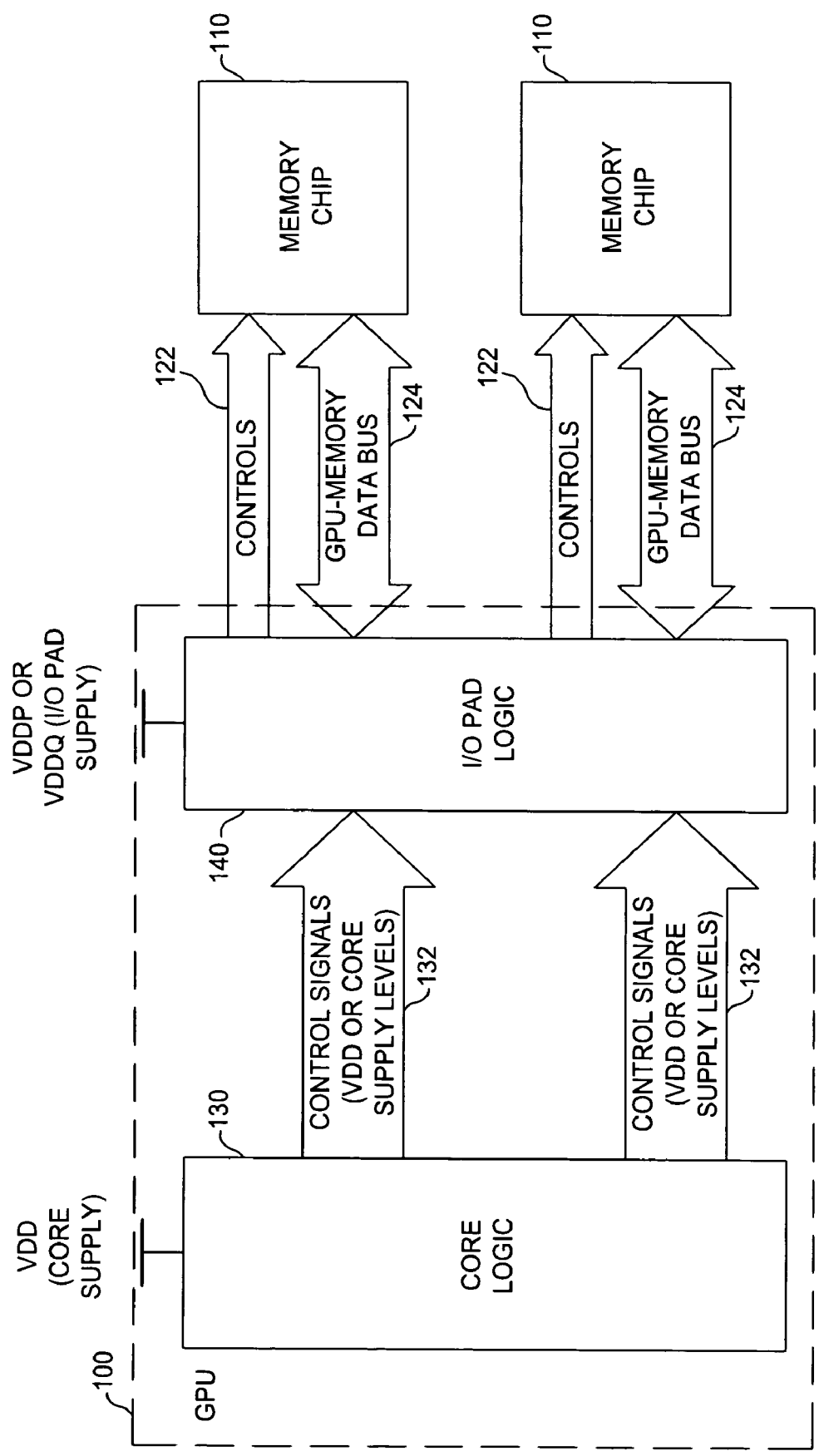
FIG. 1 illustrates an exemplary graphics subsystem with a graphics processing unit (GPU) in accordance with one embodiment of the present invention.

FIG. 1 illustrates an exemplary graphics subsystem, in which embodiments of the present invention may be used to advantage. As illustrated, a GPU 100 may access one or more memory chips 110 via control and data signals driven onto control bus 122 and data bus 124 coupled to a plurality of I/O pads (142 shown in FIG. 2) by I/O pad logic 140. The particular control and data signals driven onto the I/O pads may be generated by core logic 130 of the GPU 100. In other words, the core logic 130 may generate control and data signals 132 to be driven onto the I/O pads, for example, to read and write data to the memory devices 110.

While the data bus 124 between the GPU 100 and memory devices 110 is bi-directional, the control bus 122 typically includes one or more unidirectional data and command latching strobe (clock) signals. For example, clock enable (CKE) and chip select (CS) are very critical to the memory devices and are use to enable or disable the memory chips. In some cases, the combination of (high low) states of various other command signals may define particular commands. Accordingly, these control signals should be held in valid states whenever the memory devices are being used.

As illustrated, however, the core logic 130 may be powered from a different supply voltage (VDD) than the supply voltage used to power the I/O pad logic 140 (VDDP or VDDQ). As previously described, on system and/or device power up, the core logic supply voltage may ramp up slower than the I/O logic, resulting in a state where the I/O logic 140 may be functional before the core logic 130 is functional. In this state, it is possible that control signals originating from the core logic 130 may be in an undefined state. Driving these signals onto the command bus 122 by the I/O logic 140 may result in the inadvertent issuance of commands which could place the memory devices 110 in an inoperable state.

Power Up Detect and Control Circuit

Figure 2:
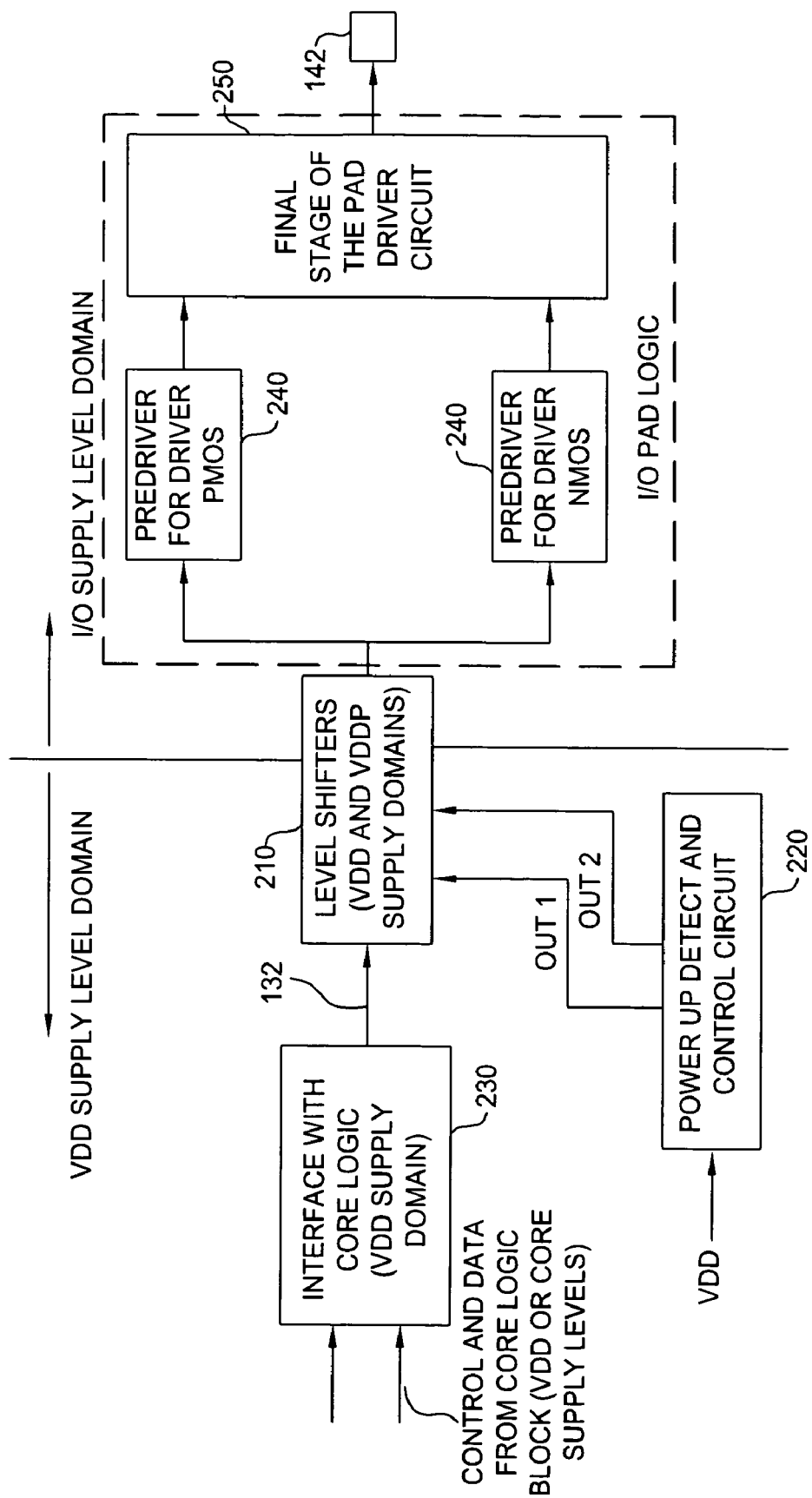
FIG. 2 illustrates an exemplary I/O pad block diagram in accordance with one embodiment of the present invention.

Therefore, in an effort to prevent undefined control signals from being driven onto the bus 122, the GPU 100 may include a voltage supply sense circuit 220, as illustrated in the exemplary I/O pad block diagram of FIG. 2. As illustrated, the sense circuit 220 may monitor the level of the core logic supply voltage (VDD) and generate one or more signals (e.g., OUT1 and OUT2) that may be used to control the output of level shifters 210. The level shifters 210 are used to convert signals from the core logic supply voltage domain (e.g., with logic swings from GND to VDD) to the I/O logic supply voltage domain (e.g., with logic swings from GND to VDDP).

As will be described in greater detail below, the level shifters 210 may be configured to generate control signals to predriver logic circuits 240 and a final stage driver circuit 250 that result in a high impedance state of the output pad in an effort to ensure the memory devices 110 will not latch in any inadvertent command signals. While only one I/O pad 142 is shown, those skilled in the art will appreciate that similar I/O pad logic 140 may be provided with each of a plurality of I/O pads 142 for the device 100. In some cases, different control signals may be provided to each different I/O pad. However, when the power up detect and control circuit 220 detects that the core logic voltage supply level is insufficient, the same signal states may be provided to each from the level shifters 210 in an effort to control the final stage driver 250 and place each output pad 142 corresponding to a particular control signal in a high impedance state.

Figure 3:
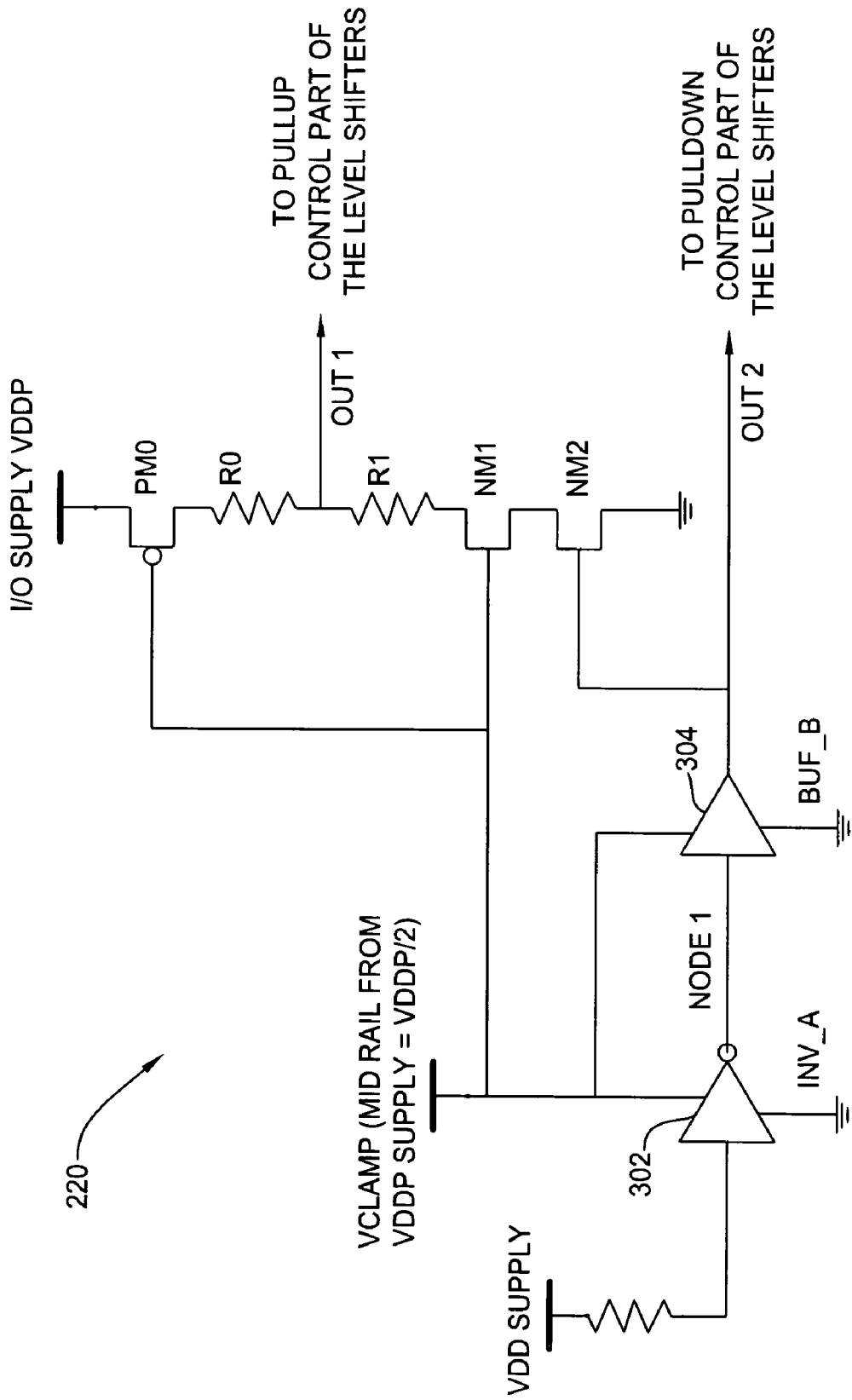
FIG. 3 illustrates a voltage supply sense circuit in accordance with one embodiment of the present invention.

FIG. 3 illustrates a voltage supply sense circuit 220 in accordance with one embodiment of the present invention. Operation of the sense circuit 220 may be understood with simultaneous reference to FIG. 4, which illustrates an exemplary timing diagram of signals shown in FIG. 3. In the exemplary sequence shown in FIG. 4, the I/O supply voltage VDDP has reached full level (at time T0), while the core logic supply voltage VDD has not yet begun to ramp up.

The sense circuit 220 includes an inverter 302 that receives, as an input, the core logic supply voltage VDD. The inverter 302 is powered from a voltage source that is set to a voltage level (VCLAMP) between VDDP and GND, for example, approximately midway (e.g., VDDP/2). Accordingly, when the core logic supply voltage VDD falls below the switching threshold of the inverter 302, the output of the inverter will swing from GND to VCLAMP.

Figure 4:
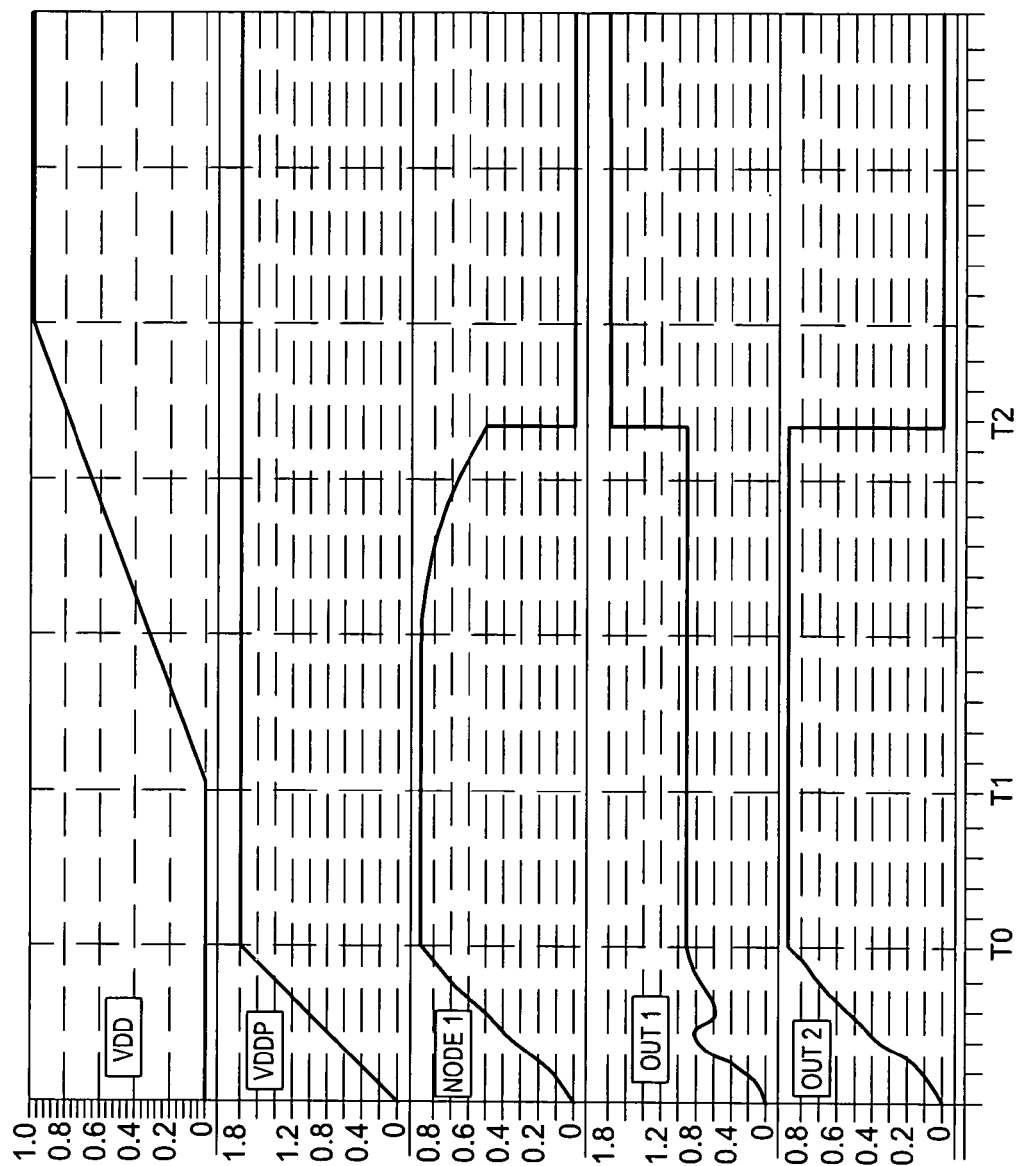
FIG. 4 illustrates an exemplary timing diagram of signals shown in FIG. 3 in accordance with one embodiment of the present invention.

As illustrated in FIG. 4, with the core logic supply voltage VDD ramping up slowly (beginning at time T1), the output of the inverter 302 (labeled as Node 1) is initially at VCLAMP. Thus, the output of buffer 304 (and control signal OUT2) is also at VCLAMP, which is sufficient to switch on pull-down NMOS transistor NM2. Because the gates of pull-down NMOS transistor NM1 and pull-up PMOS transistor PM0 are both tied to VCLAMP, these transistors are both switched on continuously. With both NM1 and NM2 switched on, the first output (OUT1) will be pulled down. For some embodiments, the transistors (PM0, NM1, and NM2) and resistors (R0 and R1) may be sized to ensure the output OUT1 is approximately VCLAMP when NM2 is switched on (meaning there is inadequate core supply voltage VDD). As will be described in greater detail below, OUT1 and OUT2 set at the intermediate voltage level VCLAMP may be used to override the normal function of the level shifters 210 and keep the final stage drivers of output pads 142 in a high impedance state.

Once the core logic supply voltage rises to a sufficient level (at time T2), however, the output of inverter 302 will swing to GND, causing the output of buffer 304 (and OUT2) to swing to GND. As a result, pull-down NMOS transistor NM2 will turn off, thereby causing OUT1 to rise to the full level of the I/O supply voltage VDDP. The values of the control signals OUT1 and OUT2 with respect to the core logic supply voltage VDD is summarized in TABLE I below.

TABLE I

Control signal levels versus VDD supply

| VDD SUPPLY | NODE1 | OUT1 | OUT2 |
| --- | --- | --- | --- |
| LOW OR GRND | HIGH (VCLAMP) | HIGH (VCLAMP) | LOW (VCLAMP) |
| HIGHER OR VDD | LOW (GND) | HIGH (VDDP) | LOW (GND) |

Exemplary Level Shifters

Figure 5A:
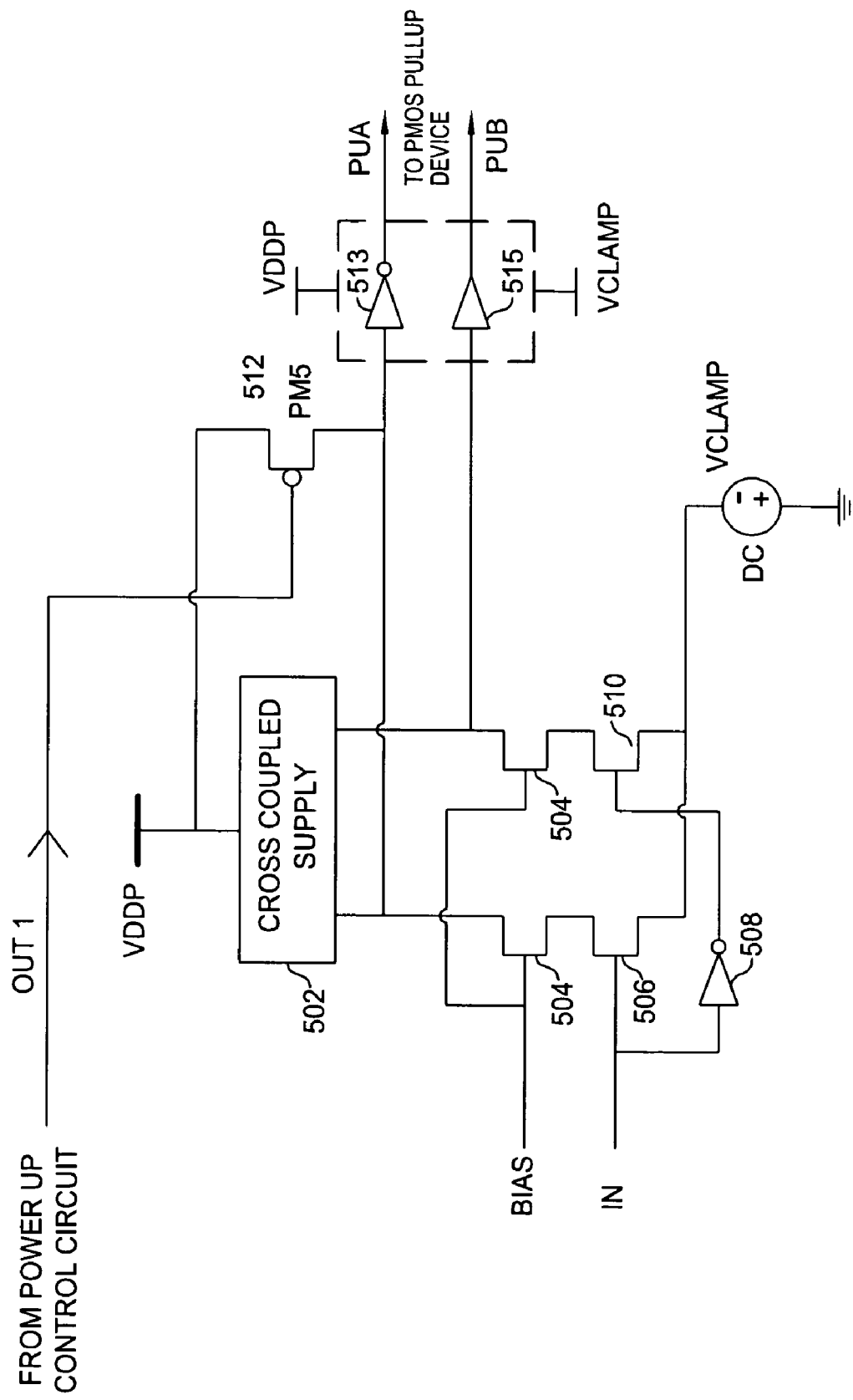
FIGS. 5A and 5B illustrated exemplary level shifters in accordance with one embodiment of the present invention.
Figure 5B:
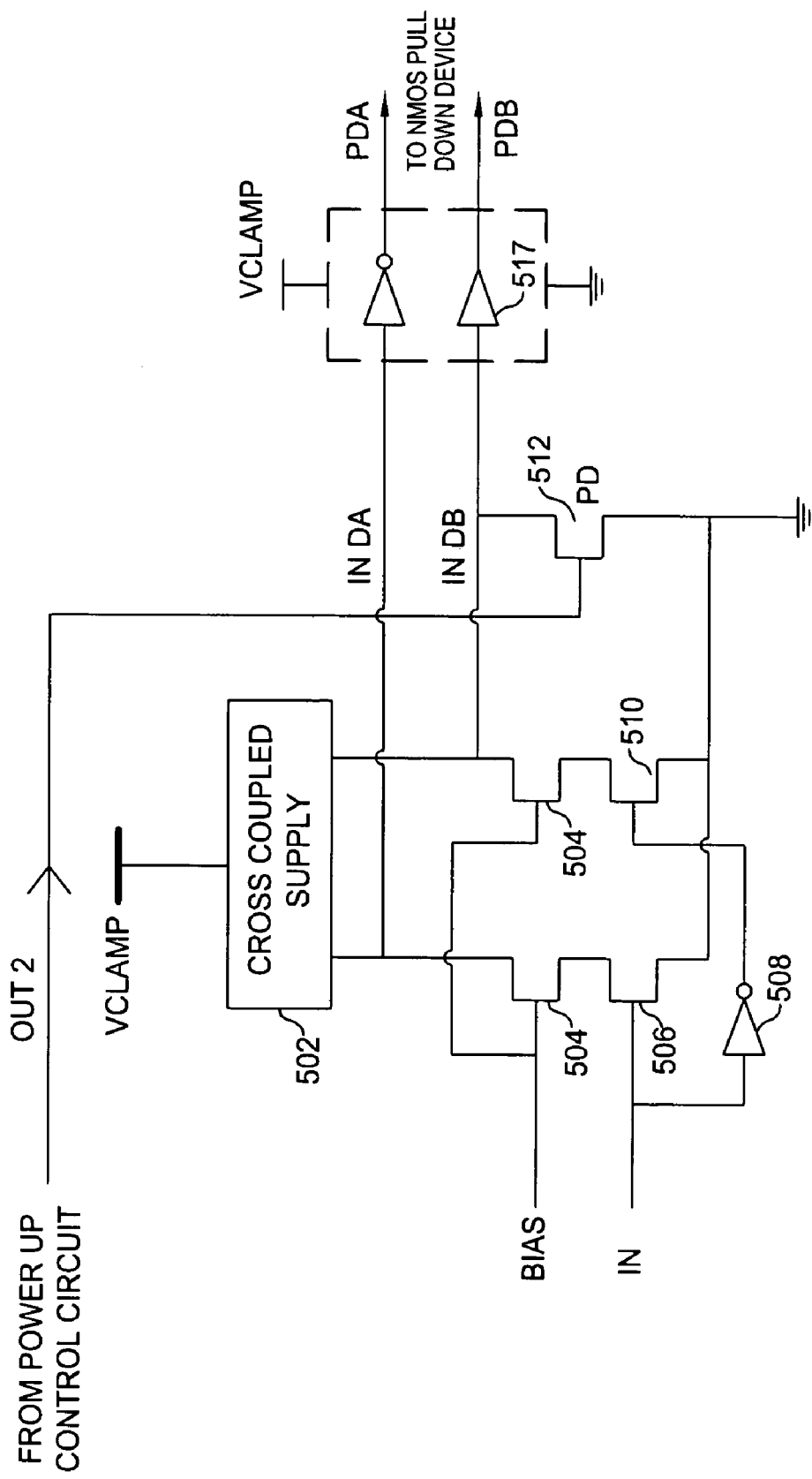

FIGS. 5A and 5B illustrated exemplary level shifters responsive to the control signals OUT1 and OUT2 generated by the sense circuit. In an effort to speed switching times (by reducing the total amount of swing during a signal transition), a pull-up level shifter (FIG. 5A) may be configured to have outputs that swing from VCLAMP (e.g., VDDP/2) to VDDP in response to an input signal supplied by core logic, while the other pull-down level shifter (FIG. 5B) may be configured to have outputs that swing from GND to VCLAMP.

Referring back to FIG. 5A, in a normal mode of operation (e.g., with sufficiently high VDD), the outputs of the pull-up level shifter PUA and PUB will operate in a complementary manner, with the state of each determined by the state of an input signal (IN) provided by the core logic. For example, if IN is high, transistor 506 will be switched on, pulling the input of buffer 513 and, thus PUA, low (VCLAMP). The high input will cause the output of inverter 508 to go low, turning off transistor 510, causing the input of buffer 515 to be pulled up through cross-coupled supply 502, bringing PUB high (VDDP). If IN switches to low, transistor 506 will turn off and transistor 510 will turn on, causing the outputs to toggle. The pull-down level shifter of FIG. 5B operates in a similar manner, however, with the outputs PDA and PDB toggling between GND and VCLAMP rather than VCLAMP and VDDP.

As illustrated in FIGS. 6A and 6B, one or more of the outputs of each of the pull-up and pull-down level shifters may be used to control a pull-up transistor PM1 and pull-down transistor NM3 in a simplified final stage driver 250. While a simplified final driver stage is shown with only one pull-up and only one pull-down transistor, those skilled in the art will recognize that more complex final stage drivers utilizing more than one pull-up transistor and/or more than one pull-down transistor may be used.

In any case, in the normal operating mode, for example, with IN high, PUA will be at VDDP and PDB will be at GND, turning off PM1 and turning on NM3, thus pulling the output pad 142 down to GND, as shown in FIG. 6A. In contrast, with IN low, PUA will be at VCLAMP and PDB will both be at GND, turning on PM1 and turning off NM3, thus pulling the output pad 142 up to VDDP, as shown in FIG. 6B.

However, when the core logic supply level is low, and the sense circuit 220 drives OUT1 and OUT2 to VCLAMP, the input signal IN to the level shifter circuits is overridden. Referring back to FIG. 5A, when OUT1 is set to VCLAMP, pull-up transistor 512PU is switched on, keeping the input to buffer 513 and PUA pulled high. As a result, the output PUA is kept high (VDDP). It should be noted that with the core logic supply voltage low, the input signal IN will also be low and there will be no contention due to pulling down as transistor 506 will be turned off. Referring now to FIG. 5B, when OUT2 is set to VCLAMP, pull-down transistor 512PD is switched on, keeping the input to buffer 517 and PDB pulled down. With PUA pulled up and PDB pulled down, both transistors PM1 and NM3 will be switched off, thus keeping the output pad 142 in a high impedance state, as shown in FIG. 6C.

CONCLUSION

By detecting when the level of supply voltage used to power core logic that generates control signals to be driven out on output pads with logic powered by a different supply voltage, embodiments of the present invention may be able to place the output pads in a high impedance state. As a result, even while the core logic supply voltage is low and the input signals to be driven out on the output pads may be undefined, inadvertent commands are prevented from being sent to the memory devices.

While the foregoing is directed to embodiments of the present invention, other and further embodiments of the invention may be devised without departing from the basic scope thereof, and the scope thereof is determined by the claims that follow.

The invention claimed is:

1. A method of controlling one or more input output (I/O) pads of an integrated circuit device having core logic powered by a first supply voltage and I/O logic powered by a second supply voltage, comprising:
    determining if the first supply voltage is below a predetermined voltage level including;
    receiving the first supply voltage as an input to a logic circuit powered from an intermediate supply voltage having a voltage level between ground and a maximum level of the first supply voltage;
    if the first supply voltage is not below the predetermined voltage level, driving onto the I/O pads control signals generated by the core logic; and
    if the first supply voltage is below the predetermined voltage level, maintaining the I/O pads in a high impedance state by the I/O logic.

2. The method of claim 1, wherein maintaining the I/O pads in a high impedance state by the I/O logic comprises generating at least one control signal at the intermediate supply voltage level.

3. The method of claim 2, wherein the at least one control signal is used to maintain one or more outputs of one or more level shifting circuits at a predetermined level regardless of an input signal provided by the control logic.

4. The method of claim 3, wherein the one or more output signals are used to turn off both pull-up and pull-down transistors of a final driver stage to place a corresponding I/O pad in a high impedance state.

5. The method of claim 1, wherein the I/O pads are coupled to a control bus between the integrated circuit device and one or more memory devices.

6. The method of claim 1, wherein the integrated circuit device is a graphics processor unit (GPU).

7. An integrated circuit device, comprising:
    one or more input/output (I/O) pads;
    core logic powered by a first supply voltage and configured to generate one or more control signals;

I/O logic powered by a second supply voltage and configured to drive control signals generated by the core logic onto the I/O pads; and power sense logic configured to monitor determine if the first supply voltage is below a predetermined voltage level and, if so, generate one or more signals to cause the I/O logic to maintain the I/O pads in a high impedance state, the power sense logic comprising a logic circuit that receives the first supply voltage as an input, wherein the logic circuit is powered from an intermediate supply voltage having a voltage level between ground and a maximum level of the first supply voltage.

8. The integrated circuit device of claim 7, wherein:

the power sense logic generates one or more signals at the intermediate supply voltage level; and the I/O logic is responsive to the one or more signals generated by the power sense logic to maintaining the I/O pads in a high impedance state.

9. The integrated circuit device of claim 8, wherein the I/O logic comprises one or more level shifting circuits that maintain one or more output signals at a predetermined level regardless of an input signal provided by the control logic.

10. The integrated circuit device of claim 9, wherein:

a first level shifting circuit generates control signals that swing between the intermediate voltage supply level and the second supply voltage; and a second level shifting circuit generates control signals that swing between the a ground level and the intermediate voltage supply level.

11. The integrated circuit device of claim 10, wherein:

the I/O logic comprises a final driver stage for each I/O pad; and the one or more output signals of the level shifting circuits maintained at the predetermined level are used to turn off both pull-up and pull-down transistors of the final driver stages to place corresponding I/O pads in a high impedance state.

12. The integrated circuit device of claim 7, wherein the integrated circuit device is a graphics processor unit (GPU).

13. A computer system, comprising:

one or more memory devices; and at least one processor device having one or more input/output (I/O) pads coupled to the memory devices via a bus, core logic powered by a first supply voltage and configured to generate one or more control signals, I/O logic powered by a second supply voltage and configured to drive control signals generated by the core logic onto the I/O pads, and power sense logic configured to determine if the first supply voltage is below a predetermined voltage level and, if so, generate one or more signals to cause the I/O logic to maintain the I/O pads in a high impedance state, the power sense logic comprising a logic circuit that receives the first supply voltage as an input, wherein the logic circuit is powered from an intermediate supply voltage having a voltage level between ground and a maximum level of the first supply voltage.

14. The computer system of claim 13, wherein the core logic is configured to generate the control signals for use in commands used to access the memory devices.

15. The computer system of claim 13, wherein the at least one processor device is a graphics processor unit (GPU).

16. The computer system of claim 13, wherein:

the power sense logic generates one or more signals at the intermediate supply voltage level; and the I/O logic is responsive to the one or more signals generated by the power sense logic to maintaining the I/O pads in a high impedance state.

17. The computer system of claim 13, wherein:

the I/O logic comprises one or more level shifting circuits that maintain one or more output signals at a predetermined level regardless of an input signal provided by the control logic and a final driver stage for each I/O pad; and the one or more output signals of the level shifting circuits maintained at the predetermined level are used to turn off both pull-up and pull-down transistors of the final driver stages to place corresponding I/O pads in a high impedance state.

* * * * *